US009248927B2

(12) United States Patent
Saito

(10) Patent No.: US 9,248,927 B2
(45) Date of Patent: Feb. 2, 2016

(54) WORK INSERTION DEVICE

(71) Applicant: TAIYO YUDEN CO., LTD., Taito-ku, Tokyo (JP)

(72) Inventor: Koji Saito, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 264 days.

(21) Appl. No.: 14/098,081

(22) Filed: Dec. 5, 2013

(65) Prior Publication Data

US 2014/0157590 A1 Jun. 12, 2014

(30) Foreign Application Priority Data

Dec. 7, 2012 (JP) .................................. 2012-268070
Aug. 8, 2013 (JP) .................................. 2013-164764

(51) Int. Cl.
*B65B 15/04* (2006.01)
*B65B 15/00* (2006.01)
*H05K 13/02* (2006.01)

(52) U.S. Cl.
CPC ............. *B65B 15/00* (2013.01); *H05K 13/021* (2013.01); *H05K 13/028* (2013.01); *Y10T 29/5313* (2015.01)

(58) Field of Classification Search
CPC .... B65B 15/00; H05K 13/021; H05K 13/028; Y10T 29/5313
See application file for complete search history.

(56) References Cited

U.S. PATENT DOCUMENTS

| 5,117,761 A * | 6/1992 | Kasai | H05K 13/0413 108/20 |
| 5,313,401 A * | 5/1994 | Kasai | H05K 13/021 29/829 |
| 6,195,878 B1 * | 3/2001 | Hata | H05K 13/0452 29/739 |
| 6,701,611 B1 * | 3/2004 | Izumida | H05K 13/08 29/829 |
| 7,330,773 B2 * | 2/2008 | Jonke | H05K 13/0408 29/832 |
| 8,584,830 B2 * | 11/2013 | Heigl | H05K 13/021 198/471.1 |

FOREIGN PATENT DOCUMENTS

| JP | H01-254510 A | 10/1989 |
| JP | H11-292252 A | 10/1999 |
| JP | 2002-029505 A | 1/2002 |
| JP | 2006-168754 A | 6/2006 |

OTHER PUBLICATIONS

A Notice of Reasons for Refusal issued by Japanese Patent Office, mailed Oct. 17, 2014, for Japanese counterpart application No. 2013-164764.

* cited by examiner

*Primary Examiner* — Carl Arbes
(74) *Attorney, Agent, or Firm* — Law Office of Katsuhiro Arai

(57) ABSTRACT

A work insertion device that can be constituted as a small, low-cost device has a structure where a transfer disk having many storage holes formed through its outer periphery part is placed such that its rotation center line is inclined upward to form a sharp angle α with a vertical line and that some of the many storage holes are positioned in the work storage chamber. The works stored in bulk state in the work storage chamber are directly stored in some of the many storage holes positioned in the work storage chamber by utilizing the intermittent turning of the transfer disk.

9 Claims, 12 Drawing Sheets

[Fig. 8]

WORK INSERTION DEVICE

FIELD OF THE INVENTION

The present invention relates to a work insertion device for sequentially inserting works such as electronic components into concaved parts arranged side by side on a tape.

DESCRIPTION OF THE RELATED ART

An insertion device of this type generally comprises: a disk-shaped transfer table having multiple work storage grooves along its outer periphery; a driving mechanism for intermittently turning the transfer table; a feed mechanism for delivering works into the work storage grooves by utilizing the times during which the intermittently turning transfer table is stopped; and an insertion mechanism for inserting the works stored in the work storage grooves, into the concaved parts of a tape, by utilizing the times during which the intermittently turning transfer table is stopped (refer to Patent Literature 1 below, for example). It should be noted that once the works have been inserted into the tape, a cover tape is joined onto the tape to seal the concaved openings and the tape is then taken up with the joined cover tape onto a reel, etc.

It is difficult to make the aforementioned work insertion device smaller, partly because the transfer table must turn intermittently in a manner oriented roughly horizontal, and partly because at least one ball feeder (also referred to as "part feeder") must be provided, as the feed mechanism, laterally to the transfer table. In addition, lowering the cost of the device is also difficult, because at least one ball feeder is needed as the feed mechanism for delivering works into the work storage grooves in the transfer table.

BACKGROUND ART LITERATURES

[Patent Literature 1] Japanese Patent Laid-open No. 2002-029505

SUMMARY

An object of the present invention is to provide a work insertion device that can be constituted as a small, low-cost device.

To achieve the aforementioned object, the present invention provides a work insertion device for sequentially inserting works such as electronic components into concaved parts arranged side by side on a tape, wherein such work insertion device comprises: a transfer disk whose rotation center line is inclined upward to form a sharp angle with the vertical line, and which has many storage holes capable of storing the works in such a way that the holes are formed through the outer periphery part so that they are arranged at an equal angular interval in the circumferential direction, where the many storage holes are evenly divided into multiple storage hole groups each including multiple storage holes; a disk driving mechanism for intermittently turning the transfer disk in units of the angle formed by the two lines connecting the centers of two adjacent storage hole groups on the transfer disk and the rotation center of the transfer disk; a work storage chamber capable of storing many of the works in bulk state, which is positioned in a manner facing the upward-facing openings of the multiple storage holes constituting at least one storage hole group on the transfer disk, and which is used to directly store works in the multiple storage holes constituting the storage hole group, through the upward-facing openings of the holes, as the transfer disk turns intermittently; a work anti-drop means for preventing the works stored in the multiple storage holes constituting the storage hole group from dropping out through the downward-facing openings of the holes as the storage hole group on the transfer disk in which works are already stored travels to the work insertion location away from the work storage chamber; a work push-out means for forcibly pushing out the works stored in the multiple storage holes constituting the storage hole group through the downward-facing openings of the holes when the storage hole group of the transfer disk in which works are already stored stops at the work insertion location; and a work guiding means, which includes multiple guiding passages that incline downward toward the multiple concaved parts in the tape from the downward-facing openings of the multiple storage holes constituting the storage hole group stopped at the work insertion location, for guiding the works pushed out through the downward-facing openings of the multiple storage holes, into the multiple concaved parts, through the multiple guiding passages.

According to the present invention, a work insertion device is provided that can be constituted as a small, low-cost device.

The aforementioned and other objects of the present invention, as well as the characteristics and effects associated with each object, are made clear in the explanations below and drawings attached hereto.

Any discussion of problems and solutions involved in the related art has been included in this disclosure solely for the purposes of providing a context for the present invention, and should not be taken as an admission that any or all of the discussion were known at the time the invention was made.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

DESCRIPTION OF THE SYMBOLS

TA—Tape, TAa—Concaved part, WO—Work, 11c—Work storage chamber, 12—Support disk, 12f—Positive-pressure air passage, 12g1 to 12g5—First positive-pressure air passage, 12h1 to 12h5—Second positive-pressure air passage, 13—Motor, 14—Transfer disk, 14d—Storage hole, G14d—Storage hole group, 15—Work push-out unit, 15b—Positive-pressure air passage, 16, 16-1, 16-2, 16-3—Work guiding unit, 16a—Guiding passage, 16b, 16c—Negative-pressure air passage, 16d—Second negative-pressure air passage, 16e—Stopper, 16f—Rod or suction nozzle up/down hole, 16g—Rod, 16h—Work detection hole, 16i—Suction nozzle, 17—Storage good/bad detection sensor, 18—Characteristics good/bad detection sensor.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
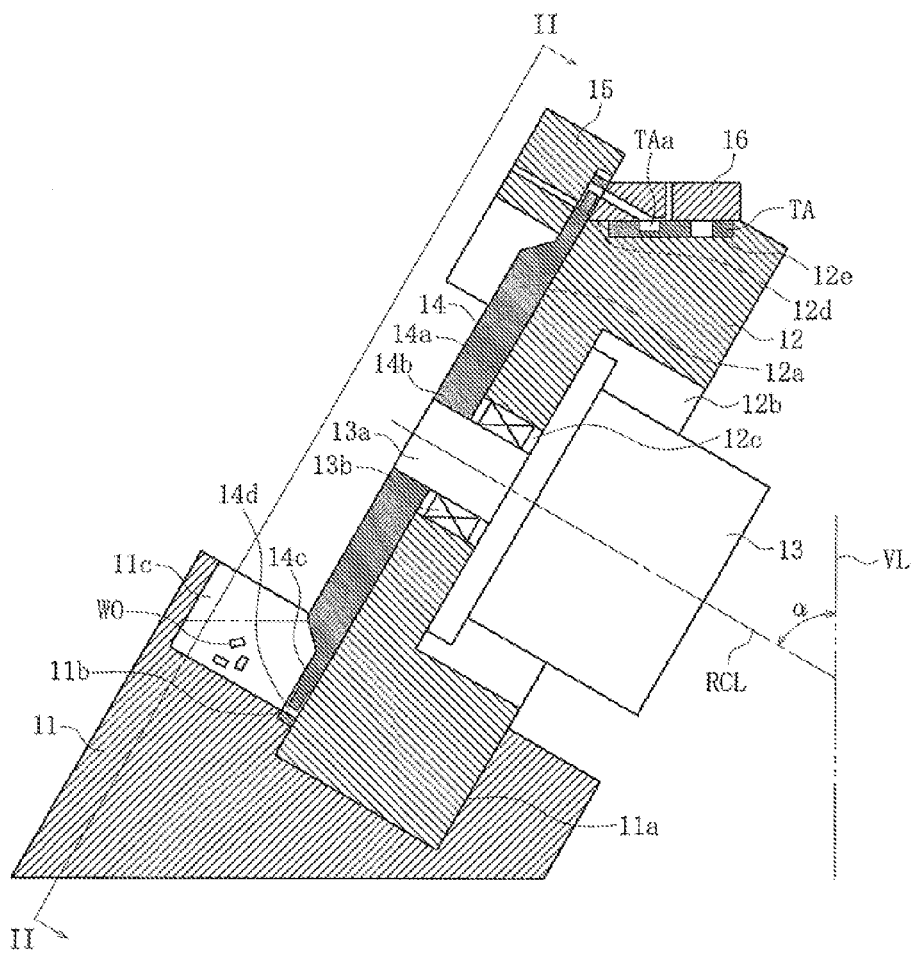
FIG. 1 is a longitudinal section view of a work insertion device to which the present invention is applied (first embodiment).

In this section, left, right, top, bottom, back and front in FIG. 1, and the corresponding sides in other figures, are referred to as front, rear, top, bottom, left and right, respectively, for the convenience of explanation.

First Embodiment (FIGS. 1 to 9)

FIGS. 1 to 9 show a work insertion device to which the present invention is applied (first embodiment).

Figure 3:
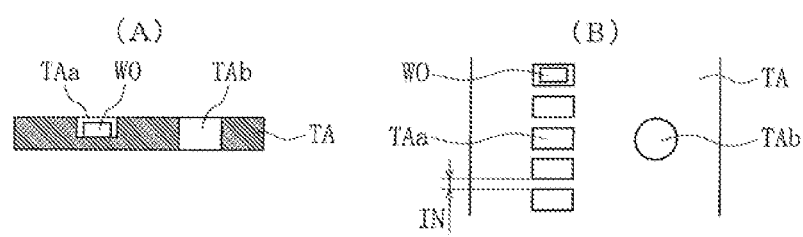
FIG. 3 consists of (A) a cross sectional view and (B) a plan view showing the tape and work shown in FIGS. 1 and 2.

First, FIG. 3 consisting of (A) and (B) is used to explain the shapes, etc., of the tape TA and work WO used by the work insertion device (first embodiment).

The work WO is shaped roughly as a rectangular solid whose reference dimensions have the dimensional relationships of length>width=height. For this work WO, a capacitor, inductor, resister, or other electronic component or non-electronic component can be used as deemed appropriate.

The tape TA is shaped as a band having a specified width and thickness. Arranged side by side on the tape TA in the traveling direction of the tape are many concaved parts TAa of roughly rectangular solid shape whose length, width and depth are slightly greater than the length, width and height of the work WO, respectively, in such a way that the length direction of each concaved part TAa crosses roughly at right angles with the traveling direction of the tape (length direction of the tape) and that an interval IN is provided between adjacent concaved parts TAa. Also arranged side by side on the tape TA in the traveling direction of the tape, at an interval greater than the interval IN, are many through holes TAb (fewer than the number of concaved parts TAa) whose lateral section is a circle, in which engagement pins of motor-driven tape traveling rollers (not illustrated) are inserted. This tape TA moves intermittently along a straight line in synchronization with the intermittent turning of a transfer disk 14 mentioned later, while being partially positioned inside guide grooves 12e in the work insertion device (refer to FIG. 1).

Next, FIGS. 1, 2, 4, 5, 6, and 7 are used to explain the structure of the work insertion device (first embodiment). In the figures, symbol 11 indicates a base, symbol 12 indicates a support disk, symbol 13 indicates a motor, symbol 14 indicates a transfer disk, symbol 15 indicates a work push-out unit, and symbol 16 indicates a work guiding unit.

Figure 2:
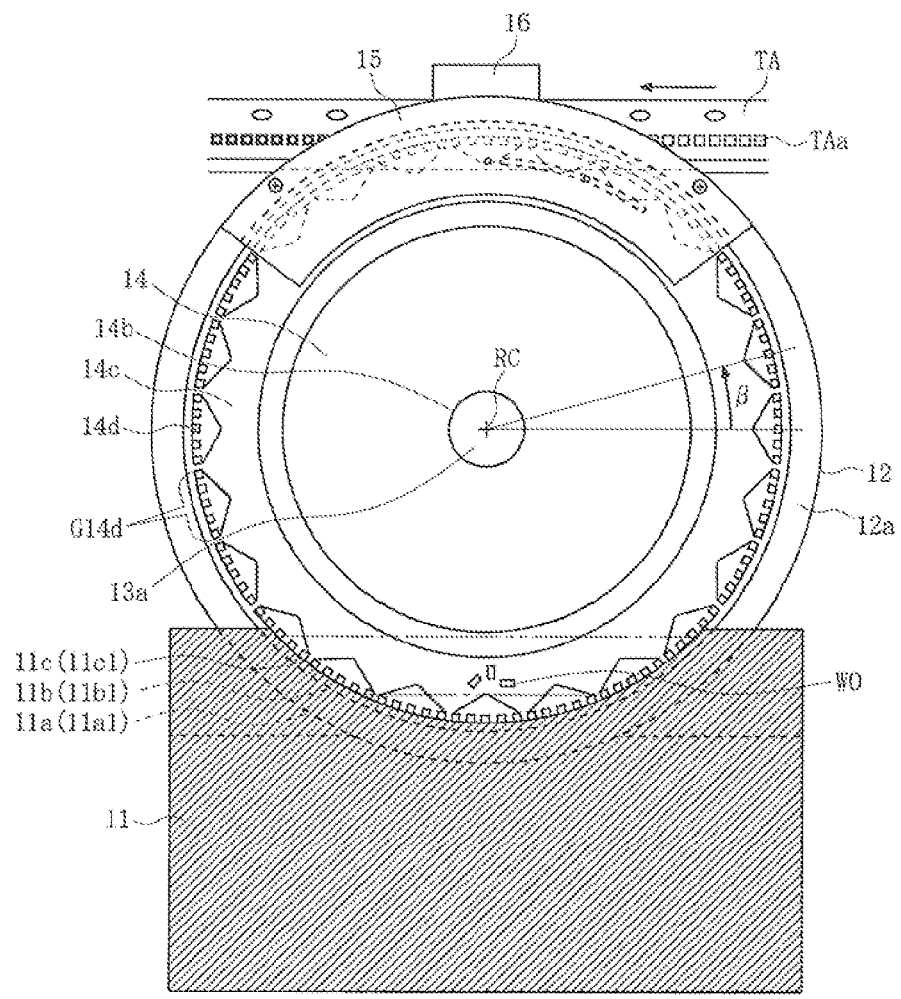
FIG. 2 is a view along line II-II in FIG. 1.

As shown in FIGS. 1 and 2, a base 11 is shaped as a rectangular solid whose bottom face is cut out diagonally, with its top face inclined to form a sharp angle (approx. 60 degrees in the figure) with the vertical line VL. Formed on the top face of the base 11 are a first concaved part 11a, a second concaved part 11b and a third concaved part 11c, in this order, from rear to front. The first concaved part 11a, second concaved part 11b and third concaved part 11c all have a bow-shaped section along line II-II, while the width of the first concaved part 11a is roughly the same as the thickness of the support disk 12, the radius of curvature of the inner periphery surface of the first concaved part is roughly the same as the radius of the support disk 12, and the center of the radius of curvature is positioned on the rotation center line RCL. In addition, the width of the second concaved part 11b is slightly greater than the thickness t (refer to FIG. 4 (B)) of an outer periphery part 14c of the transfer disk 14, the radius of curvature of the inner periphery surface of the second concaved part is smaller than the radius of the support disk 12 and slightly greater than the radius of the transfer disk 14, and the center of the radius of curvature is positioned on the rotation center line RCL. Furthermore, the width of the third concaved part 11c is arbitrary, the radius of curvature of the inner periphery surface of the third concaved part is the same as or slightly greater than the radius of a virtual circle enclosing all of storage holes 14d of the transfer disk 14, and the center of the radius of curvature is positioned on the rotation center line RCL.

As shown in FIGS. 1 and 2, the support disk 12 is shaped roughly as a disk having a specified thickness and radius and its front face is flat (hereinafter referred to as "first flat surface 12a"). A circular concaved part 12b in which to place the motor 13 is formed at the center of the rear face of the support disk 12, while a through hole 12c reaching the first flat surface 12a is formed at the center of the front face (bottom face) of the circular concaved part 12b. In addition, a second flat surface 12d reaching the outer periphery surface from the top of the first flat surface 12a is formed on the support disk 12, while a guide groove 12e in which to place a part of the tape TA is formed on the second flat surface 12d. The width of the guide groove 12e is slightly greater than the width of the tape TA, and its depth is slightly greater than the thickness of the tape TA.

This support disk 12 is secured with its bottom press-fit into the first concaved part 11a of the base 11, and therefore the first flat surface 12a inclines upward in a manner forming a sharp angle (approx. 30 degrees in the figure) with the vertical line VL, while the second flat surface 12d forms approx. 90 degrees with the vertical line VL.

As shown in FIGS. 1 and 2, the body (no symbol) of the motor 13 is secured inside the circular concaved part 12b of the support disk 12, where a motor shaft 13a is placed via a bearing 13b in the through hole 12c of the support disk 12, with its tip projecting from the first flat surface 12a. The rotation center line RCL corresponds to the center line of the motor shaft 13a, and the rotation center line RCL inclines upward in a manner forming a sharp angle α (approx. 60 degrees in the figure) with the vertical line VL.

This motor 13 is a pulse motor, etc., and can intermittently turn the transfer disk 14 in the counterclockwise direction in FIG. 2, based on a signal from the motor driver (not illustrated) in units of angle β (approx. 15 degrees in the figure) formed by the two lines connecting the centers of two adjacent storage hole groups G14d on the transfer disk 14 and the rotation center RC of the transfer disk 14.

As shown in FIGS. 1 and 2, the transfer disk 14 is shaped roughly as a disk having a specified thickness and radius, and its rear face is flat (hereinafter referred to as "flat surface 14a"). A through hole 14b is formed at the center of the transfer disk 14, and an outer periphery part 14c thinner than the thickness of the center is formed on the outer periphery of the disk 14, where the thickness t (refer to FIG. 4 (B)) of the outer periphery part 14c is slightly greater than the length of the work WO. In addition, formed through the outer periphery part 14c of the transfer disk 14 are many (120 in the figure) storage holes 14d that are shaped roughly as a rectangular solid having a length, width and height slightly greater than the length, width and height of the work WO, or many storage holes 14d each capable of storing the work WO in the length direction, arranged side by side at an equal angular interval in the circumferential direction.

Of the four interior surfaces of each storage hole 14d, the two interior surfaces on the inner side and outer side are oriented roughly in parallel with the rotation center line RCL. Also, when a virtual circle enclosing all of the storage holes 14d is drawn on the front face of the outer periphery part 14c, the virtual circle overlaps roughly with the outer side of the front opening of each storage hole 14d. The radius of this virtual circle is smaller than the radius of the transfer disk 14, while the interval between two adjacent storage holes 14d in the circumferential direction is roughly the same as the interval IN between the concaved parts TAa in the tape TA.

Figure 4:
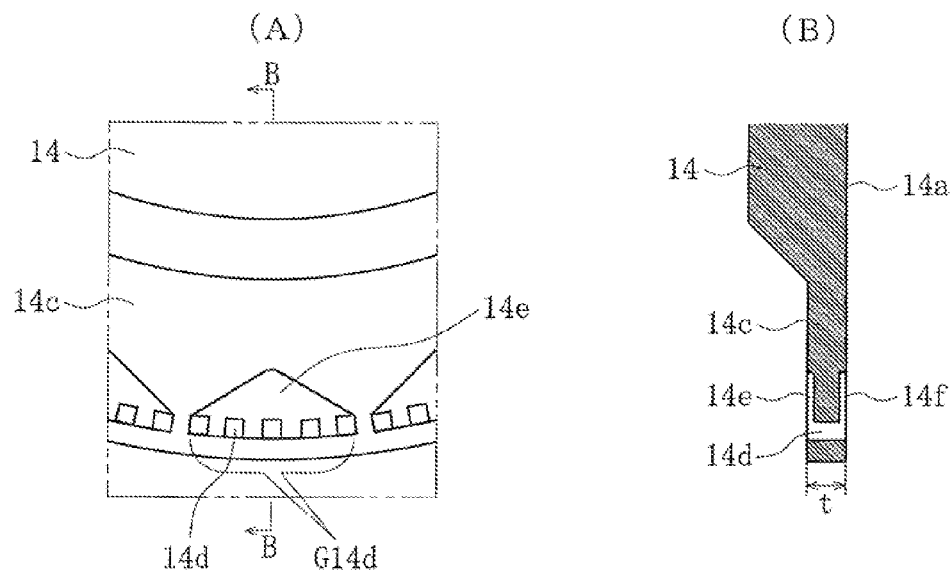
FIG. 4 consists of (A) an enlarged front view of key parts of the transfer disk shown in FIGS. 1 and 2, and (B) a section view along line B-B in FIG. 4 (A).
Figure 5:
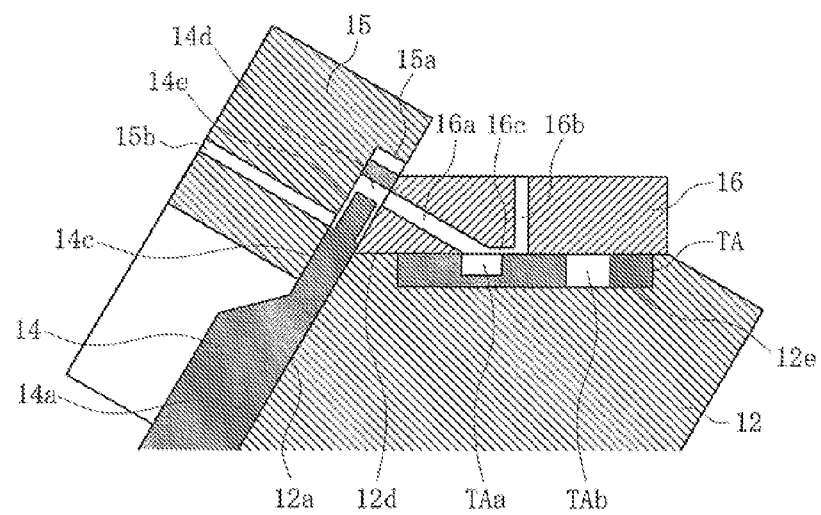
FIG. 5 is an enlarged view of key parts in FIG. 1.
Figure 6:
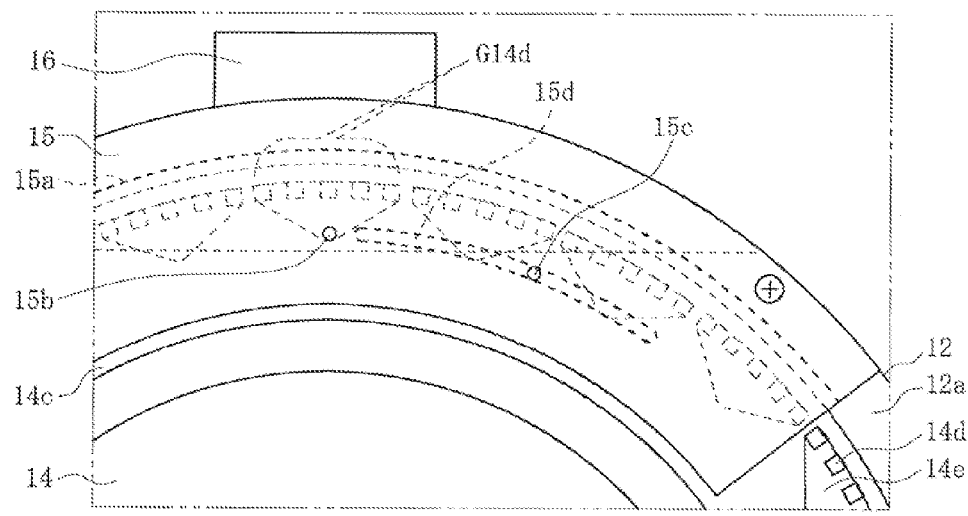
FIG. 6 is an enlarged view of key parts in FIG. 2.
Figure 7:
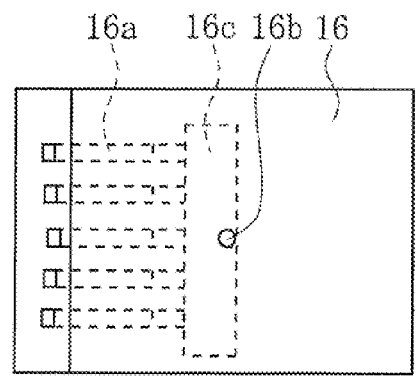
FIG. 7 is an enlarged top view of the work guiding unit shown in FIGS. 1 and 2.

Also as shown in FIG. 4 consisting of (A) and (B), the many storage holes 14d of the transfer disk 14 are evenly divided into multiple (24 in the figure) storage hole groups G14d, each including multiple (five in the figure) storage holes 14d, while formed on the front face and rear face of the outer periphery part 14c at a specified depth are multiple (24 in the figure) air pockets 14e, 14f that each form an approximate triangle enclosing the multiple storage holes 14d constituting each storage hole group G14d. Since the effective length of each storage hole 14d (length contributing to the storage of the work WO) becomes shorter when both air pockets 14e, 14f are set deeper, preferably the depth of both air pockets 14e, 14f is kept to the absolute minimum, or for example, to one-tenth to one-twentieth of the length of the storage hole 14d.

This transfer disk 14 is installed on the projected part of the motor shaft 13a via its through hole 14b in a freely attachable/detachable manner so that the flat surface 14a contacts the first flat surface 12a of the support disk 12 in a freely rotatable manner. The transfer disk 14 is made freely attachable/detachable in order to facilitate inspection, repair, cleaning, etc., when the disk is removed. The flat surface 14a of the transfer disk 14 installed on the projected part of the motor shaft 13a, and front face of the outer periphery part 14d, incline upward in a manner forming a sharp angle (approx. 30 degrees in the figure) with the vertical line VL, and the center line of each storage hole 14d also inclines upward in a manner forming a sharp angle (approx. 30 degrees in the figure) with the vertical line VL. It should be noted that, because the rotation center RC of the transfer disk 14 is on the rotation center line RCL, the rotation center line RCL also corresponds to the rotation center line of the transfer disk 14.

In other words, because the transfer disk 14 is positioned in a manner inclining upward, the front openings of the many storage holes 14d formed through its outer periphery part 14c are facing upward (hereinafter referred to as "upward-facing openings"), while the rear openings are facing downward (hereinafter referred to as "downward-facing openings"). Furthermore, the downward-facing openings of storage holes 14d other than the multiple storage holes 14d positioned above the second flat surface 12d of the support disk 12 are blocked by the first flat surface 12a of the support disk 12.

Also, the width of the second concaved part 11b of the base 11 is set slightly greater than the thickness t of the outer periphery part 14c of the transfer disk 14, while the radius of curvature of the inner periphery surface of the second concaved part is set smaller than the radius of the support disk 12 and slightly greater than the radius of the transfer disk 14. Furthermore, the radius of curvature of the inner periphery surface of the third concaved part 11c is set the same as or slightly greater than the radius of a virtual circle enclosing all of the storage holes 14d of the transfer disk 14. As a result, the transfer disk 14 is such that its ring-shaped area present on the outer side of all of the storage holes 14d of the outer periphery part 14c is stored in the second concaved part 11b of the base 11 in a freely rotatable manner.

Moreover, the space in the third concaved part 11c of the base 11 provides a work storage chamber facing the upward-facing openings of the multiple storage holes 14d constituting some (five or six in the figure) of the multiple storage hole groups G14d provided in the outer periphery part 14c of the transfer disk 14 (hereinafter referred to as "work storage chamber 11c"). This work storage chamber 11c can store multiple works WO in bulk state (state in which multiple works WO exist in random orientations).

As shown in FIGS. 1, 2, 5 and 6, the work push-out unit 15 is shaped as an arc having a specified width, and installed on top of the first flat surface 12a of the support disk 12 in a freely attachable/detachable manner. The work push-out unit 15 is made freely attachable/detachable in order to facilitate inspection, repair, cleaning, etc., when the unit is removed. Formed on the rear face of the work push-out unit 15 is an arc-shaped concaved part 15a having a specified width. The width of the arc-shaped concaved part 15a is slightly greater than the thickness t of the outer periphery part 14c of the transfer disk 14, while the radius of curvature of the inner periphery surface of the arc-shaped concaved part is slightly greater than the radius of the transfer disk 14, and the center of the radius of curvature is on the rotation center line RCL shown in FIG. 1. Accordingly, the transfer disk 14 can turn intermittently without being obstructed by the work push-out unit 15.

In addition, formed in the work push-out unit 15 is a positive-pressure air passage 15b that connects to the air pocket 14e on the front side of one of the multiple storage hole groups G14d provided in the outer periphery part 14c of the transfer disk 14 when the storage hole group G14d stops at the work insertion location (location where the topmost storage hole group G14d is stopped in FIG. 2), where the front opening of the positive-pressure air passage 15b is connected to an air circuit via a tube (not illustrated).

Also formed in the work push-out unit 15 are negative-pressure air passages 15c, 15d that connect to the air pocket 14e on the front side of the multiple (two in the figure) storage hole groups G14d immediately to the right of the storage hole group G14d stopping at the work insertion location. To be specific, the negative-pressure air passage 15d forms an arc that overlaps with the air pocket 14e on the front side of the multiple storage hole groups G14d, while the negative-pressure air passage 15c is formed in a position where it connects to a part of the negative-pressure air passage 15d, and the front opening of the negative-pressure air passage 15c is connected to an air circuit via a tube (not illustrated).

In other words, when one of the multiple storage hole groups G14d provided in the outer periphery part 14c of the transfer disk 14 stops at the work insertion position, positive-pressure air flowing from the upward-facing opening to the downward-facing opening of each hole can be applied, via the positive-pressure air passage 15b, in the multiple storage holes 14d constituting the storage hole group G14d. In short, in a condition where works WO are stored in the multiple storage holes 14d constituting the storage hole group G14d stopped at the work insertion location, the works WO can be pushed out of the storage holes 14d from the downward-facing openings by means of the positive-pressure air.

Also, even when the downward-facing openings of the multiple storage holes 14d positioned to the immediate right of the storage hole group G14d stopped at the work insertion location are opened, among the multiple storage holes 14d positioned above the second flat surface 12d of the support disk 12, dropping of the works WO stored in the multiple storage holes 14d to the right, from the downward-facing openings due to their own weight, can be prevented by means of negative-pressure air through the negative-pressure air passages 15c, 15d.

As shown in FIGS. 1, 2, 5 and 7, the work guiding unit 16 forms roughly a rectangular solid shape and is installed in a freely attachable/detachable manner on the second flat surface 12d of the support disk 12 so that its front inclination surface lies flush with the first flat surface 12a. The work guiding unit 16 is made freely attachable/detachable in order to facilitate inspection, repair, cleaning, etc., when the unit is removed. The work guiding unit 16 has multiple (five in the figure) guiding passages 16a having upward-facing openings that face the downward-facing openings of the multiple (five in the figure) storage holes 14d constituting one of the multiple storage hole groups G14d provided in the outer periphery part 14c of the transfer disk 14 when the storage hole group G14d stops at the work insertion location, as well as downward-facing openings that face the multiple (five in the figure) concaved parts TAa in the tape TA. The internal shape of each guiding passage 16a roughly agrees with the internal shape of the storage hole 14d, and inclines downward (to the rear) from the downward-facing openings of the multiple storage holes 14d toward the multiple concaved parts TAa. Furthermore, the work guiding unit 16 has negative-pressure air passages 16b, 16c formed on it that connect to the downward-facing openings of the multiple guiding passages 16a. To be specific, the negative-pressure air passage 16c forms a shape that connects to multiple guiding passages 16a, while the negative-pressure air passage 16b is formed in a position where it connects to a part of the negative-pressure air passage 16c, and the top opening of the negative-pressure air passage 16b is connected to an air circuit via a tube (not illustrated).

In other words, the works WO pushed out from the downward-facing openings of the multiple storage holes 14d constituting the storage hole group G14d stopped at the work insertion location can be guided, via each guiding passage 16a, into the multiple concaved parts TAa in the tape TA.

Also when one of the multiple storage hole groups G14d provided in the outer periphery part 14c of the transfer disk 14 stops at the work insertion position, negative-pressure air flowing from the upward-facing opening to the downward-facing opening of each passage can be applied, via the negative-pressure air passages 16b, 16c, in the multiple guiding passages 16a. In short, the works WO pushed out into the guiding passages 16a from the downward-facing openings of the multiple storage holes 14d constituting the storage hole group G14d stopped at the work insertion location are pulled in toward the rear by means of negative-pressure air, so that the works WO can be inserted roughly simultaneously into the same number of concaved parts TAa as the multiple storage holes 14d in the tape TA.

Next, FIGS. 1, 2, 8 and 9 are used to explain the work insertion operation of the work insertion device (first embodiment).

Figure 8:
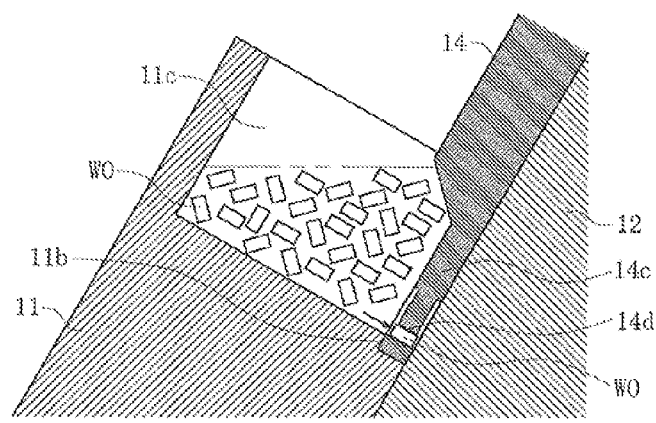
FIG. 8 is a drawing explaining the work insertion operation of the work insertion device shown in FIGS. 1 and 2.
Figure 9:
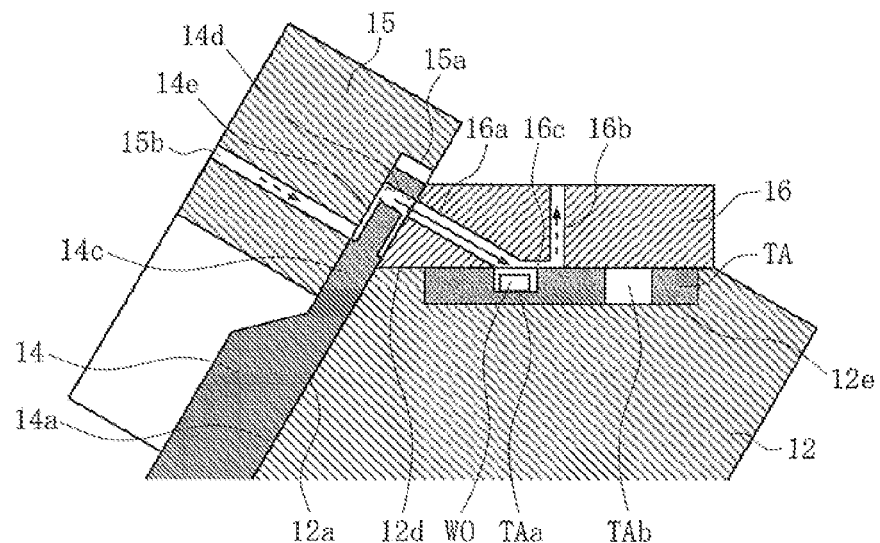
FIG. 9 is a drawing showing the work insertion operation of the work insertion device shown in FIGS. 1 and 2.

When the work insertion operation is started, many works WO of the same dimensions and type are introduced into the work storage chamber 11c, as shown in FIG. 8, while the tape TA is partially placed in the guide grooves 12e, as shown in FIGS. 1 and 9. The two-dot chain lines shown in FIGS. 1 and 8 represent the maximum storage limit of works WO in the work storage chamber 11 c, where the many works WO that have been introduced are stored in bulk state in the work storage chamber 11c.

Then, as shown in FIG. 2, the transfer disk 14 is turned intermittently in the counterclockwise direction in units of angle β, while the tape TA is moved intermittently along a straight line to the left in synchronization with the intermittent turning. The transfer disk 14 is turned intermittently in such a way that one of the multiple storage hole groups G14d provided in the outer periphery part 14c of the transfer disk 14 sequentially stops at the work insertion location. The tape TA is moved intermittently in such a way that, when one of the multiple storage hole groups G14d provided in the outer periphery part 14c of the transfer disk 14 stops at the work insertion location, the same number of concaved parts TAa as the multiple storage holes 14d constituting the storage hole group G14d sequentially stop to the rear side of the work insertion location. In addition, positive-pressure air is applied in the positive-air passage 15b of the work push-out unit 15 at the start of intermittent turning of the transfer disk 14, while negative-pressure air is applied in the negative-pressure air passages 15c, 15d of the work push-out unit 15 as well as the negative-pressure air passages 16b, 16c of the work guiding unit 16.

The intermittently turning transfer disk 14 is such that some of the multiple storage hole groups G14d are always positioned in the work storage chamber 11c, and that the upward-facing openings of the multiple storage holes 14d positioned in the work storage chamber 11c face the work storage chamber 11c. Accordingly, the works WO stored in the work storage chamber 11c are directly stored in the multiple storage holes 14d positioned in the work storage chamber 11c as the transfer disk 14 turns intermittently, as shown in FIG. 8.

The multiple works WO introduced into the work storage chamber 11c have normally completed an appearance inspection, characteristics inspection, and various other inspections, and because the multiple works WO stored in the work storage chamber 11c, while being displaced by the intermittent turning of the transfer disk 14, move toward the storage holes 14d due to their own weight by utilizing the inclination of the inner periphery surface of the work storage chamber 11c, direct storage of the works WO into the multiple storage holes 14d is achieved smoothly.

While the storage hole group G14d in which works are already stored eventually reaches the work insertion location due to the intermittent turning of the transfer disk 14, the downward-facing openings of storage holes 14d other than the multiple storage holes 14d positioned above the second flat surface 12d of the support disk 12, among the multiple storage holes 14d provided in the outer periphery part of the transfer disk 14, are blocked by the first flat surface 12a of the support disk 12 and therefore the works WO stored in these other storage holes 14d do not drop out from the downward-facing openings due to their own weight. Furthermore, although the downward-facing openings of the multiple storage holes 14d to the immediate right of the storage hole group G14d stopped at the work insertion location are open, among the multiple storage holes 14d positioned above the second flat surface 12d of the support disk 12, negative-pressure air is applied in these multiple storage holes 14d to the right, via the front air pocket 14e from the negative-pressure air passages 15c, 15d of the work push-out unit 15, and therefore the works WO stored in these storage holes 14d to the right do not drop out from the downward-facing openings due to their own weight.

When the storage hole group G14d in which works are already stored stops at the work insertion location due to the intermittent turning of the transfer disk 14, the tape TA also stops at the rear of the work insertion location and the multiple storage holes 14d constituting the storage hole group G14d connect to the same number of concaved parts TAa as the multiple storage holes 14d, via the multiple guiding passages 16a of the work guiding unit 16.

As shown in FIG. 9, positive-pressure air is applied, via the positive-pressure air passage 15b of the work push-out unit 15, in the multiple storage holes 14d constituting the storage hole group G14d stopped at the work insertion location, while negative-pressure air is applied, via the negative-pressure air passages 16b, 16c, in the multiple guiding passages 16a of the work guiding unit 16.

As a result, the works WO stored in the multiple storage holes 14d constituting the storage hole group G14d stopped at the work insertion location are forcibly pushed out, by the positive-pressure air, into the multiple guiding passages 16a from the downward-facing openings of the storage holes 14d, and then the works WO pushed out into the multiple guiding passages 16a are pulled in toward the rear due to the negative-pressure air, after which the works WO pulled in toward the rear drop by their own weight through the downward-facing openings of the guiding passages 16a and consequently the works WO are inserted roughly simultaneously into the same number of concaved parts TAa as the multiple storage holes 14 in the tape TA.

Upon elapse of the stopping time during the intermittent turning of the transfer disk 14, the transfer disk 14 turns by angle β and then stops again, while the tape TA moves by a specified distance and then stops again, and the works are sequentially inserted in the same manner as described above.

Next, the effects of the aforementioned work insertion device (first embodiment) are explained.

(E1) The transfer disk 14 having many storage holes 14d formed by boring in the outer periphery part 14c is inclined upward to form a sharp angle α between its rotation center line RCL and the vertical line VL, while some of the many storage holes 14d are positioned in the work storage chamber 11c, and therefore the device can be made smaller than a conventional device comprising a transfer disk 14 and a transfer table arranged in a manner facing and lying roughly horizontal with the transfer disk, with at least one ball feeder placed laterally thereto, and because no ball feeder is required, the device cost can also be reduced.

(E2) The works WO stored in bulk state in the work storage chamber 11c can be directly stored in some of the many storage holes 14d positioned in the work storage chamber 11c by utilizing the intermittent turning of the transfer disk 14, and therefore the intermittent turning speed of the transfer disk 14 (corresponding to the number of revolutions of the transfer disk 14 per unit time) can be increased over that of a conventional device where works are fed from one or more ball feeders into the work storage grooves in the transfer table facing the transfer disk 14.

For example, if the intermittent turning speed of the transfer table of the conventional device is increased by allowing works to be stored in the multiple work storage grooves in the transfer table from multiple ball feeders, the work feeding speed of each ball feeder cannot follow the intermittent turning speed of the transfer table and works may not be stored in the work storage grooves. With the aforementioned work insertion device (first embodiment), on the other hand, such phenomenon does not occur even when the intermittent turning speed of the transfer disk 14 is increased, and consequently the storage operation occurs without fail and the intermittent moving speed of the tape TA (corresponding to the amount of movement of the tape TA per unit time) can also be increased.

(E3) The number of multiple (five in the figure) storage holes 14d constituting the storage hole group G14d is used as the unit of measure and works WO are inserted into the concaved parts TAa in the tape TA by this unit, and therefore the unit number of works WO to be inserted can be changed with ease by simply changing the number of multiple storage holes 14d constituting the storage hole group G14d and the number of multiple guiding passages 16a. Needless to say, the intermittent turning speed of the transfer disk 14 and intermittent moving speed of the tape TA can be increased further by increasing as much as possible the unit number of works WO to be inserted.

(E4) The works WO stored in the multiple storage holes 14d constituting the storage hole group G14d stopped at the work insertion location can be forcibly pushed out of the holes from their downward-facing openings, and this not only prevents the works WO from remaining in the multiple storage holes 14d at the time of insertion of works, but it also allows the works WO to be pushed out of the multiple storage holes 14d into the multiple guiding passages 16a without fail.

(E5) Positive-pressure air is utilized to forcibly push out the works WO stored in the multiple storage holes 14d, while negative-pressure air is utilized to guide the works WO in the multiple guiding passages 16a, and therefore the push-out of works WO into the multiple guiding passages 16a from the multiple storage holes 14d and guidance of works WO in the multiple guiding passages 16a can be achieved smoothly.

Figure 10:
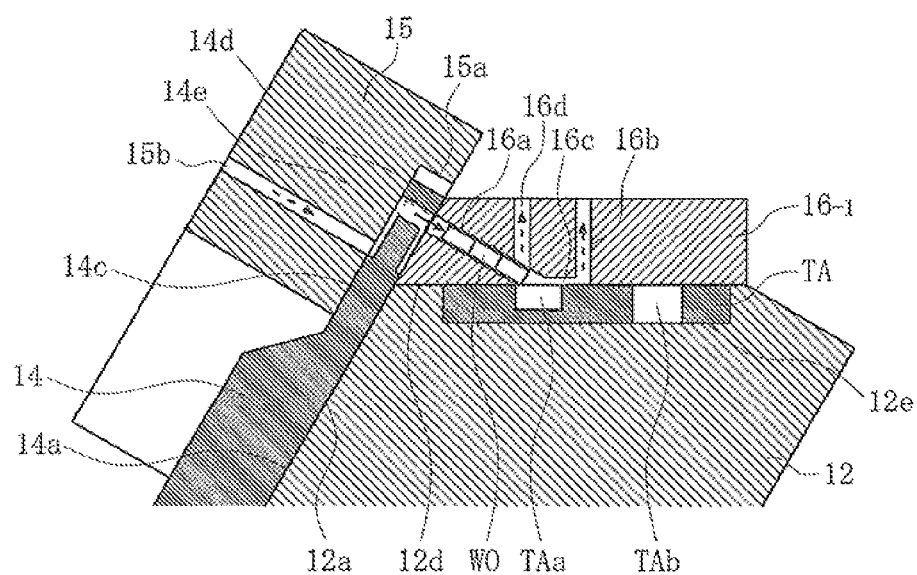
FIG. 10 is a drawing corresponding to FIG. 5, showing a work insertion device to which the present invention is applied (second embodiment).
Figure 11:
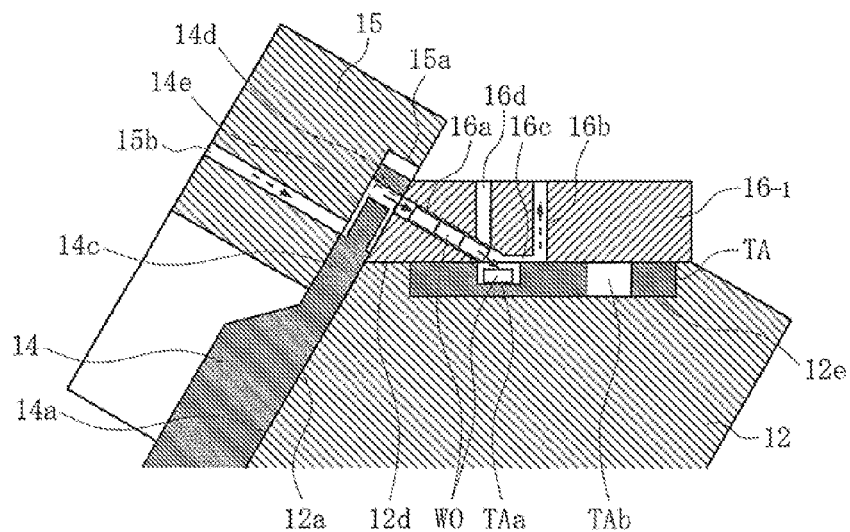
FIG. 11 is a drawing showing the work insertion operation of the work insertion device shown in FIG. 10.

Second Embodiment (FIGS. 10 and 11)

FIGS. 10 and 11 show a work insertion device to which the present invention is applied (second embodiment).

This work insertion device (second embodiment) is structurally different from the aforementioned work insertion device (first embodiment) in that a work guiding unit 16-1 is used in place of the work guiding unit 16. To be specific, this work guiding unit 16-1 is structurally different from the work guiding unit 16 of the aforementioned work insertion device (first embodiment) in the following points, as shown in FIG. 10:

Multiple (five in the figure) guiding passages 16a each have enough length to store multiple (three in the figure) works WO inside in succession; and Second negative-pressure air passages 16d (total five passages) for stopping of the works are provided above the location on the front side of the downward-facing openings of the guiding passages 16a, in a manner connecting to the location on the front side.

The top opening of each second negative-pressure air passage 16d is connected to an air circuit via a tube (not illustrated) so that, among the multiple works WO stored in the guiding passages 16a, the first works WO can be inserted into the multiple (five in the figure) concaved parts TAa in the tape TA in a controlled manner by means of applying, and stopping the application of, negative-pressure air to each second negative-pressure air passage 16d.

Next, FIGS. 10 and 11 are used to explain the work insertion operation of the work insertion device (second embodiment) only in the context of how this work insertion operation differs, specifically from that of the aforementioned work insertion device (first embodiment).

As for insertion of works, the transfer disk 14 is turned intermittently in such a way that the storage hole groups G14d in which works are already stored stop multiple times (at least three times) at the work insertion location, as shown in FIG. 10, in order to store multiple works WO in the multiple guiding passages 16a. When this happens, negative-pressure air is applied to each second negative-pressure air passage 16d in such a way that the first work WO in the second negative-pressure air passage 16d stops at the bottom opening position of the second air passage 16d because of the negative-pressure air, with the subsequent works WO following it in succession.

Thereafter, as shown in FIG. 11, the transfer disk 14 is turned and tape TA is moved intermittently and then the application of negative-pressure air to each second air passage 16d is temporarily stopped as the transfer disk 14 and tape TA stop. This way, the first work WO in each guiding passage 16a drops by its own weight through the downward-facing opening of the guiding passage 16a and gets inserted in each of the multiple concaved parts TAa in the tape TA.

When this insertion occurs, works WO are also replenished into each guiding passage 16a because the intermittent turning of the transfer disk 14 is stopped (refer to FIG. 11). When the insertion is completed, negative-pressure air is again applied to each second negative-pressure air passage 16d to make the first work WO in the second negative-pressure air passage 16d stop at the bottom opening position of the second negative-pressure air passage 16d by means of this negative-pressure air, with the subsequent works WO following it in succession (refer to FIG. 10).

According to this work insertion device (second embodiment), the same effects of the aforementioned work insertion device (first embodiment) can be achieved. In addition, because multiple works WO are stored in each guiding passage 16a and then the works WO are inserted into the multiple concaved parts TAa in the tape TA, work insertion can be implemented at specified timings in a smooth manner even when no work WO is stored in at least one of the multiple storage holes 14d constituting the storage hole group G14d stopped at the work insertion location.

Figure 12:
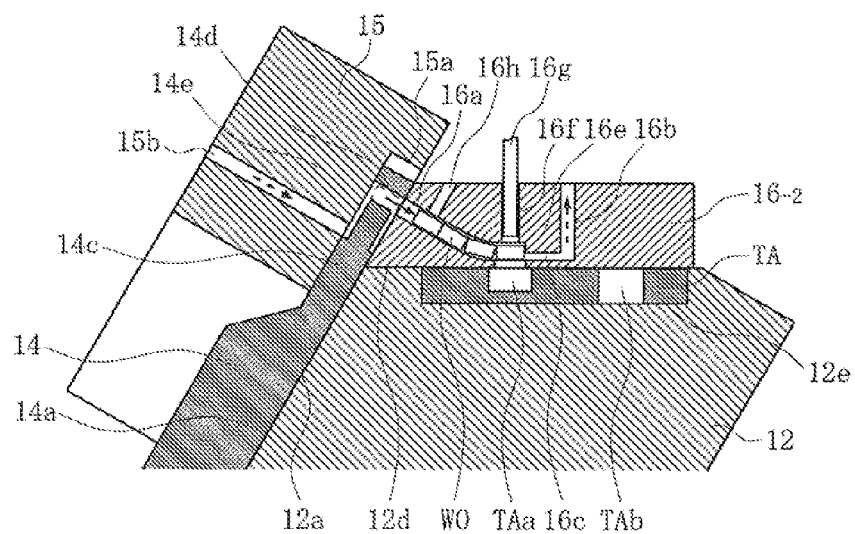
FIG. 12 is a drawing corresponding to FIG. 5, showing a work insertion device to which the present invention is applied (third embodiment).
Figure 13:
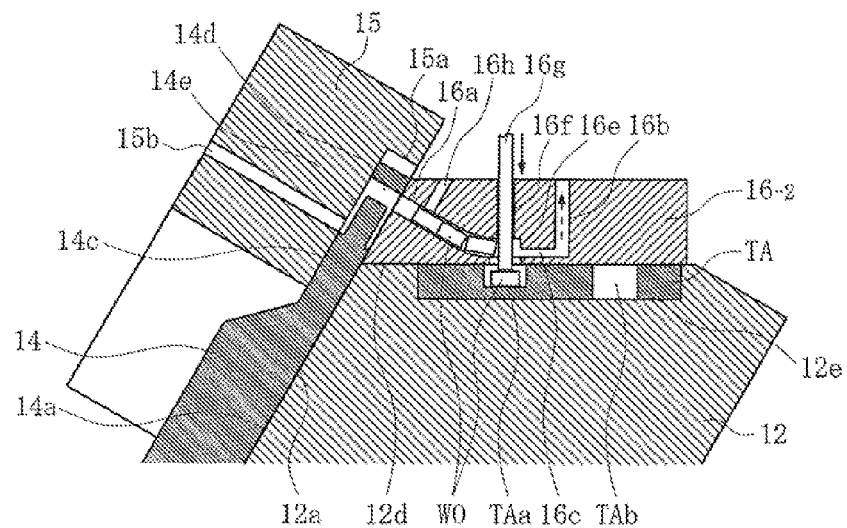
FIG. 13 is a drawing showing the work insertion operation of the work insertion device shown in FIG. 12.

Third Embodiment (FIGS. 12 and 13)

FIGS. 12 and 13 show a work insertion device to which the present invention is applied (third embodiment).

This work insertion device (third embodiment) is structurally different from the aforementioned work insertion device (first embodiment) in that a work guiding unit 16-2 is used in place of the work guiding unit 16. To be specific, this work guiding unit 16-2 is structurally different from the work guiding unit 16 of the aforementioned work insertion device (first embodiment) in the following points, as shown in FIG. 12:

Multiple (five in the figure) guiding passages 16a each have enough length to store multiple (three in the figure) works WO inside in succession; and A work positioning stopper 16e is provided at the rear edge of each guiding passage 16a;

Rod up/down holes 16f (total five holes) are provided above the downward-facing openings of the guiding passages 16a in a manner connected to the downward-facing openings;

Rods 16g (total five rods) are provided in the rod up/down holes 16f in a manner freely movable up and down; and Work detection holes 16h (total five holes) are provided near the upward-facing openings of the guiding passages 16a in order to detect whether or not the necessary number (three in the figure) of works WO are stored in each guiding passage 16a.

Each rod 16g is installed at an up/down part of an up/down mechanism (not illustrated) using a solenoid, motor, etc., and among the multiple works WO stored in each guiding passage 16a, the first work WO can be inserted into each of the multiple (five in the figure) concaved parts TAa in the tape TA in a controlled manner by means of the downward movement and returning (upward movement) of each rod 16g.

Also, each work detection hole 16h has a detection part of a detection mechanism (not illustrated), such as an optical fiber for detection in a detection mechanism using a reflective optical sensor, so that whether or not the necessary number (three in the figure) of works WO are stored in each guiding passage 16a can be detected based on the amount of light entering the optical fiber for detection.

Next, FIGS. 12 and 13 are used to explain the work insertion operation of the work insertion device (third embodiment) only in the context of how this work insertion operation differs, specifically from that of the aforementioned work insertion device (first embodiment).

As for insertion of works, the transfer disk 14 is turned intermittently in such a way that the storage hole groups G14d in which works are already stored stop multiple times (at least three times) at the work insertion location, as shown in FIG. 12, in order to store multiple works WO in the multiple guiding passages 16a. As the first work WO in each guiding passage 16a stops upon contacting each stopper 16e, the subsequent works WO follow it in succession.

Once the storage of the necessary number of works in each guiding passage 16a has been detected by the detection mechanism, only the tape TA is moved intermittently and each rod 16g is lowered from the raised position as the tape TA stops, as shown in FIG. 13. This way, the first work WO in each guiding passage 16a is forcibly pushed down through the downward-facing opening of the guiding passage 16a and the work WO is inserted into each of the multiple concaved parts TAa in the tape TA.

Thereafter, each rod 16g is returned to the raised position from the lowered position and whether or not the necessary number of works are stored in each guiding passage 16a is detected again. If the necessary number of works WO are stored, only the tape TA is moved intermittently and work insertion is performed in the same manner as described above (refer to FIG. 13). If the necessary number of works WO are not stored, on the other hand, the transfer disk 14 is also moved intermittently in conjunction with the intermittent movement of the tape TA to replenish works WO in each guiding passage 16a (refer to FIG. 12).

According to this work insertion device (third embodiment), the same effects of the aforementioned work insertion device (first embodiment) can be achieved. In addition, because multiple works WO are stored in each guiding passage 16a and then the works WO are inserted into the multiple concaved parts TAa in the tape TA, work insertion can be implemented at specified timings in a smooth manner even when no work WO is stored in at least one of the multiple storage holes 14d constituting the storage hole group G14d stopped at the work insertion location.

Figure 14:
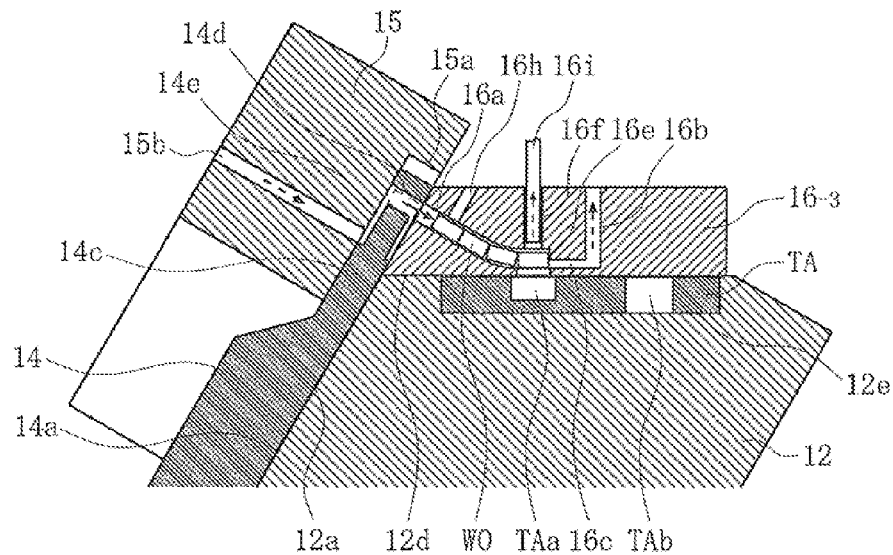
FIG. 14 is a drawing corresponding to FIG. 5, showing a work insertion device to which the present invention is applied (fourth embodiment).
Figure 15:
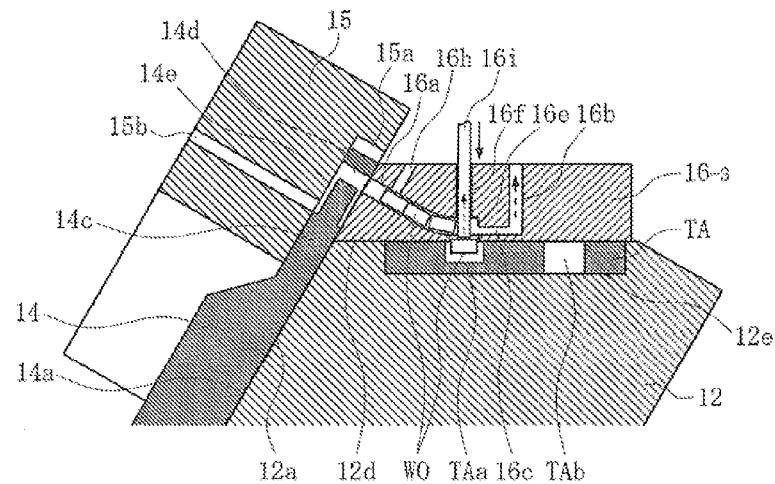
FIG. 15 is a drawing showing the work insertion operation of the work insertion device shown in FIG. 14.
Figure 16:
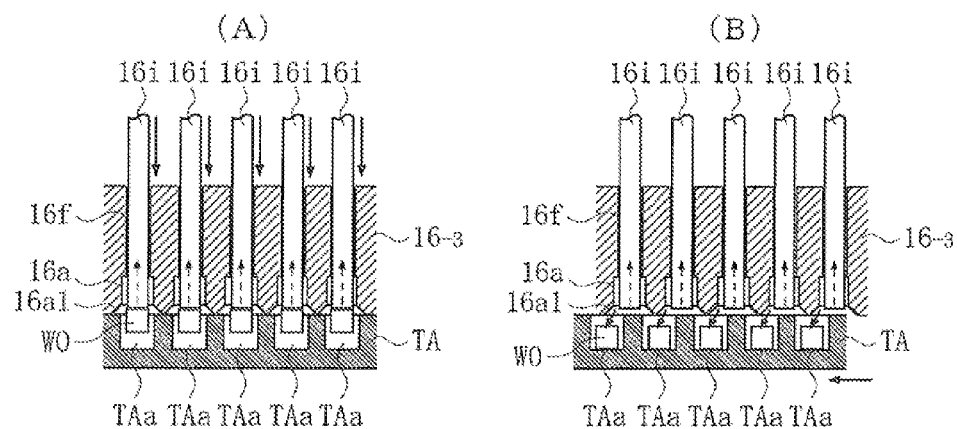
FIG. 16 consists of (A) and (B) which are drawings showing the work insertion operation of the work insertion device shown in FIG. 14.

Fourth Embodiment (FIGS. 14 to 16)

FIGS. 14 to 16 show a work insertion device to which the present invention is applied (fourth embodiment).

This work insertion device (fourth embodiment) is structurally different from the aforementioned work insertion device (first embodiment) in that a work guiding unit 16-3 is used in place of the work guiding unit 16. To be specific, this work guiding unit 16-3 is structurally different from the work guiding unit 16 of the aforementioned work insertion device (first embodiment) in the following points, as shown in FIG. 14:

- Multiple (five in the figure) guiding passages 16a each have enough length to store multiple (three in the figure) works WO inside in succession; and
- A work positioning stopper 16e is provided at the rear edge of each guiding passage 16a;
- Suction nozzle up/down holes 16f (total five holes) are provided above the downward-facing openings of the guiding passages 16a in a manner connected to the downward-facing openings;
- Suction nozzles 16i (total five nozzles) are provided in the suction nozzle up/down holes 16f in a manner freely movable up and down;
- Work detection holes 16h (total five holes) are provided near the upward-facing openings of the guiding passages 16a in order to detect whether or not the necessary number (three in the figure) of works WO are stored in each guiding passage 16a; and
- The interior surface of each guiding passage 16a at its downward-facing opening 16a1 in the tape traveling direction (length direction of the tape) is inclined in a manner extending outward from the top to bottom.

Each suction nozzle 16i is installed at an up/down part of an up/down mechanism (not illustrated) using a solenoid, motor, etc., while the top opening of each suction nozzle 16i is connected to an air circuit via a tube (not illustrated), and among the multiple works WO stored in each guiding passage 16a, the first work WO can be inserted into each of the multiple (five in the figure) concaved parts TAa in the tape TA in a controlled manner by means of the downward movement and returning (upward movement) of each suction nozzle 16i.

Also, each work detection hole 16h has a detection part of a detection mechanism (not illustrated), such as an optical fiber for detection of a detection mechanism using a reflective optical sensor, so that whether or not the necessary number (three in the figure) of works WO are stored in each guiding passage 16a can be detected based on the amount of light entering the optical fiber for detection.

Next, FIGS. 14, 15, 16 (A) and 16 (B) are used to explain the work insertion operation of the work insertion device (fourth embodiment) only in the context of how this work insertion operation differs, specifically from that of the aforementioned work insertion device (first embodiment).

As for insertion of works, the transfer disk 14 is turned intermittently in such a way that the storage hole groups G14d in which works are already stored stop multiple times (at least three times) at the work insertion location, as shown in FIG. 14, in order to store multiple works WO in the multiple guiding passages 16a. As the first work WO in each guiding passage 16a stops upon contacting each stopper 16e, the subsequent works WO follow it in succession.

Once the storage of the necessary number of works in each guiding passage 16a has been detected by the detection mechanism, only the tape TA is moved intermittently and each suction nozzle 16i is lowered from the standby position (raised position) as the tape TA stops, as shown in FIG. 13. As shown in FIG. 16 (A), the lowered position of each suction nozzle 16i is a position at which the top edge of the work WO projects slightly from the top face of the tape TA. This way, the first work WO in each guiding passage 16a is forcibly pushed down through the downward-facing opening of the guiding passage 16a while being picked up at the bottom opening of each suction nozzle 16i, and the work WO, except for its top edge, is inserted into each of the multiple concaved parts TAa in the tape TA.

Once each suction nozzle 16i has been lowered, only the tape TA is moved intermittently, as shown in FIG. 16 (B). This way, the work WO being picked up at the bottom opening of each suction nozzle 16i is separated from the bottom opening of the suction nozzle 16i by the inclined surface of each guiding passage 16a at its downward-facing opening 16a1, and the work WO is inserted into each of the multiple concaved parts TAa in the tape TA.

Thereafter, each suction nozzle 16i is returned to the raised position from the lowered position and whether or not the necessary number of works are stored in each guiding passage 16a is detected again. If the necessary number of works WO are stored, only the tape TA is moved intermittently and work insertion is performed in the same manner as described above (refer to FIGS. 15, 16 (A) and 16 (B)). If the necessary number of works WO are not stored, on the other hand, the transfer disk 14 is also moved intermittently in conjunction with the intermittent movement of the tape TA to replenish works WO in each guiding passage 16a (refer to FIG. 14).

According to this work insertion device (fourth embodiment), the same effects of the aforementioned work insertion device (first embodiment) can be achieved. In addition, because multiple works WO are stored in each guiding passage 16a and then the works WO are inserted into the multiple concaved parts TAa in the tape TA, work insertion can be implemented at specified timings in a smooth manner even when no work WO is stored in at least one of the multiple storage holes 14d constituting the storage hole group G14d stopped at the work insertion location.

Figure 17:
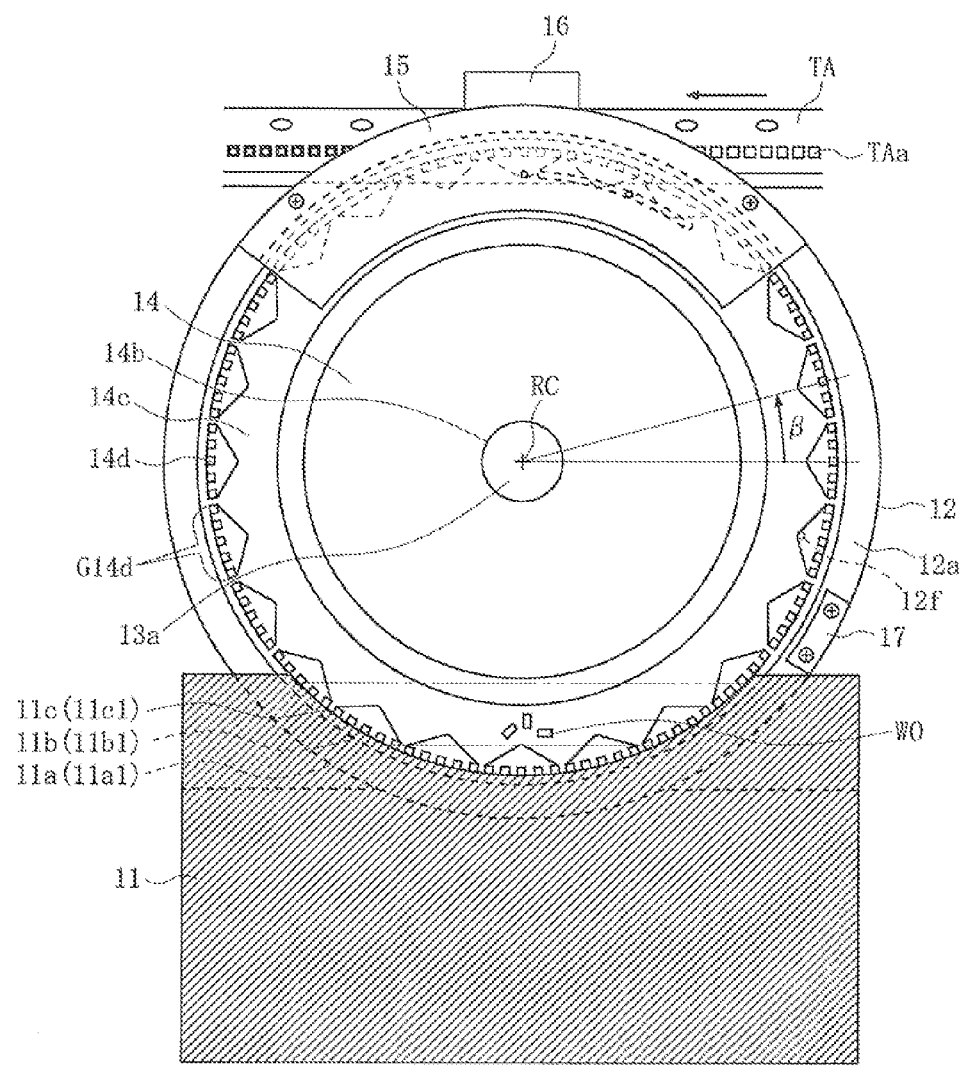
FIG. 17 is a drawing corresponding to FIG. 2, showing a work insertion device to which the present invention is applied (fifth embodiment).
Figure 18:
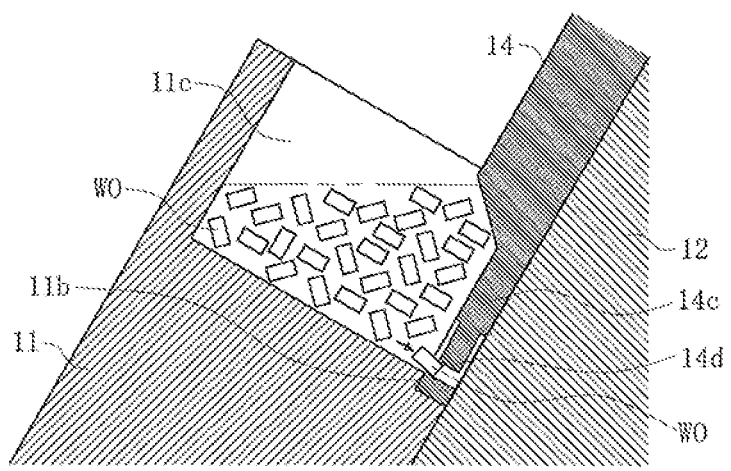
FIG. 18 is a drawing corresponding to FIG. 8, showing an example of storage failure.

Fifth Embodiment (FIGS. 17 and 18)

FIGS. 17 and 18 show a work insertion device to which the present invention is applied (fifth embodiment).

This work insertion device (fifth embodiment) is structurally different from the aforementioned work insertion device (first embodiment) in the following points:

A storage good/bad detection sensor 17 is provided to separately detect whether the storage of each work WO in the multiple storage holes 14d constituting the storage hole group G14d is good or bad when the storage hole group G14d in which works are already stored stops at the work storage good/bad inspection location (corresponding to the location where the storage good/bad detection sensor 17 is placed in FIG. 17) before the work insertion location as a result of intermittent turning of the transfer disk 14; and A positive-pressure air passage 12f and work return chute (not illustrated) are provided to return all works WO stored in the multiple storage holes 14d constituting the storage hole group G14d into the work storage chamber 11c by means of positive-pressure air when even one badly stored work WO is found among the works WO stored in the multiple storage holes 14d constituting the storage hole group G14d stopped at the work storage good/bad inspection location and consequently the storage hole group G14d stops at the work return location upstream of the work storage good/bad inspection location (next stop location above the work storage good/bad inspection location) as a result of intermittent turning of the transfer disk 14.

The storage good/bad detection sensor 17 has multiple (five in the figure) photoelectric elements of the same number as the multiple (five in the figure) storage holes 14d constituting the storage hole group G14d, and the photoelectric elements face the air pocket 14e sides of the multiple storage holes 14d constituting the storage hole group G14d when the storage hole group G14d in which works are already stored stops at the work storage good/bad inspection location. Also, the storage good/bad detection sensor 17 is connected to a detector (not illustrated) that determines whether storage is good or bad based on the signal from the storage good/bad detection sensor 17.

The positive-pressure air passage 12f is formed on the first flat surface 12a of the support disk 12 so that, when the storage hole group G14d stops at the work return location, its front opening connects to the air pocket 12f on the rear side of the storage hole group G14d. The opening on the opposite side of the front opening of this positive-pressure air passage 12f is connected to an air circuit via a tube (not illustrated).

According to this work insertion device (fifth embodiment), the following functions can be achieved in addition to the work insertion operation achievable by the aforementioned work insertion device (first embodiment).

When the storage hole group G14d in which works are already stored stops at the work storage good/bad inspection location before the work insertion location as a result of intermittent turning of the transfer disk 14, whether the storage of each work WO in the multiple storage holes 14d constituting the storage hole group G14d is good or bad is detected separately by the storage good/bad detection sensor 17.

Examples of bad storage include, among others, cases where a work WO is stored at an angle or in other incomplete manner in at least one of the multiple storage holes 14d constituting the storage hole group G14d stopped at the work storage good/bad inspection location (refer to FIG. 18) and cases where no work WO is stored in at least one of the multiple storage holes 14d.

If even one badly stored work is detected and consequently the storage hole group G14d stops at the work return location upstream of the work storage good/bad inspection location as a result of intermittent turning of the transfer disk 14, the positive-pressure air from the positive-pressure air passage 12f is applied upward, via the air pockets 14f, from the downward-facing openings of the multiple storage holes 14d constituting the storage hole group G14d and all works WO are discharged from the upward-facing openings of the storage holes 14d, with the discharged works WO returned to the work storage chamber 11c through the work return chute and stored again.

Needless to say, the aforementioned returning of works WO does not occur when no badly stored work is detected, in which case the storage hole group G14d in which works are already stored reaches the work insertion location as a result of intermittent turning of the transfer disk 14.

As described earlier, the many works WO introduced into the work storage chamber 11c have normally completed an appearance inspection, characteristics inspection, and various other inspections, and therefore badly stored works as mentioned above will not be detected. Should a badly stored work as mentioned above be detected, however, it can be prevented without fail for the storage hole group G14d in which works are already stored, including the badly stored work WO, to reach the work insertion location. Another advantage is that, because all works WO are returned into the work storage chamber 11c when even one badly stored work is detected, the works WO are not wasted but they can be reused instead.

Figure 19:
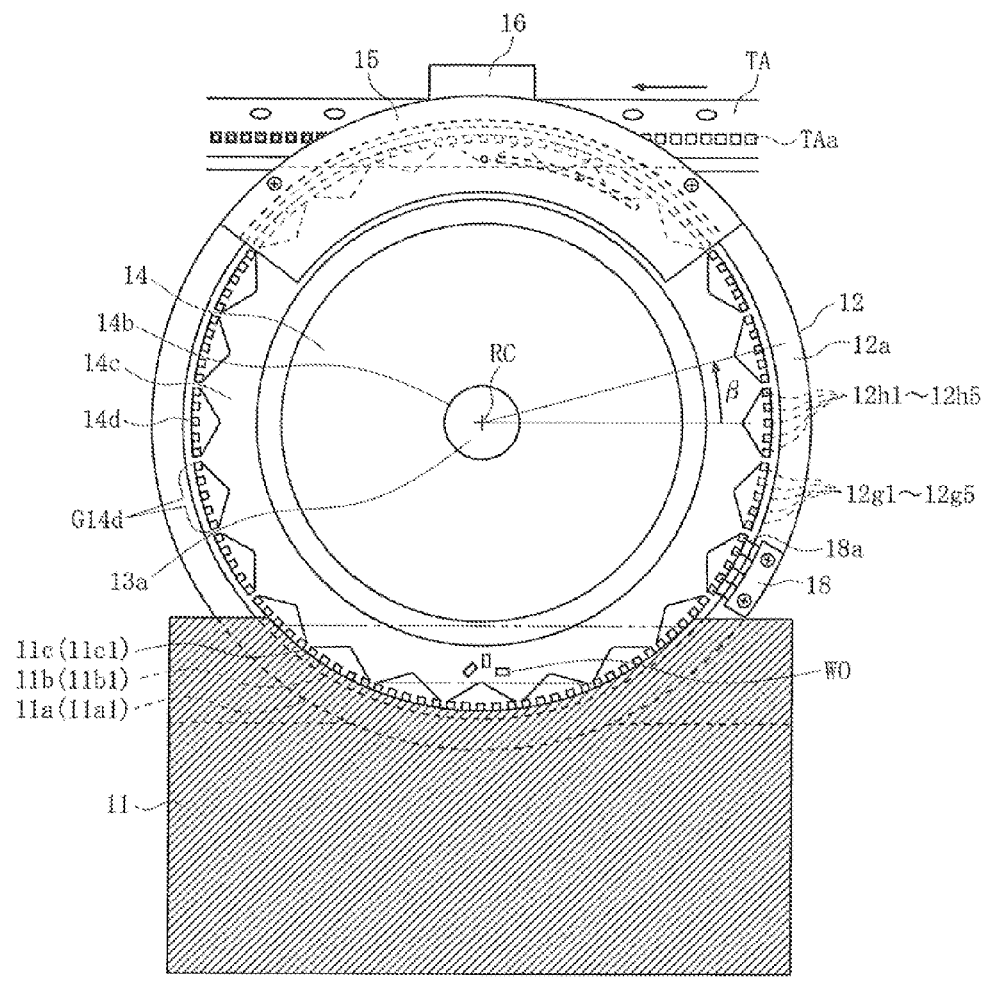
FIG. 19 is a drawing corresponding to FIG. 2, showing a work insertion device to which the present invention is applied (sixth embodiment).

Sixth Embodiment (Refer to FIG. 19.)

FIG. 19 shows a work insertion device to which the present invention is applied (sixth embodiment).

This work insertion device (sixth embodiment) is structurally different from the aforementioned work insertion device (first embodiment) in the following points:

A characteristics good/bad detection sensor 18 is provided to separately detect whether the characteristics of each work WO stored in the multiple storage holes 14d constituting the storage hole group G14d are good or bad when the storage hole group G14d in which works are already stored stops at the work characteristics good/bad inspection location (corresponding to the location where the characteristics good/bad detection sensor 18 is placed in FIG. 19) before the work insertion location as a result of intermittent turning of the transfer disk 14;

First positive-pressure air passages 12g1 to 12g5 and work return chute (not illustrated) are provided to discharge works WO of good characteristics among the works WO stored in the multiple storage holes 14d constituting the storage hole group G14d and return them into the work storage chamber 11c by means of positive-pressure air when even one work WO of bad characteristics is found among the works WO stored in the multiple storage holes 14d constituting the storage hole group G14d stopped at the work characteristics good/bad inspection location and consequently the storage hole group G14d stops at the work return location upstream of the work characteristics good/bad inspection location (next stop location above the work characteristics good/bad inspection location) as a result of intermittent turning of the transfer disk 14; and Second positive-pressure air passages 12h1 to 12h5 and work disposal chute (not illustrated) are provided to discharge works WO of bad characteristics among the works WO stored in the multiple storage holes 14d constituting the storage hole group G14d and dispose of them, instead of returning them into the work storage chamber 11c, by means of positive-pressure air when even one work WO of bad characteristics is found among the works WO stored in the multiple storage holes 14d constituting the storage hole group G14d stopped at the work characteristics good/bad inspection location and consequently the storage hole group G14d stops at the work disposal location upstream of the work return location (next stop location above the work return location) as a result of intermittent turning of the transfer disk 14.

The characteristics good/bad detection sensor 18 has multiple (five in the figure) detection probes 18a of the same number as the multiple (five in the figure) storage holes 14d constituting the storage hole group G14d, and the detection probes contact one end in the length direction of the works WO stored in the multiple storage holes 14d constituting the storage hole group G14d when the storage hole group G14d in which works are already stored stops at the work characteristics good/bad inspection location. Also, the characteristics good/bad detection sensor 18 is connected to a detector (not illustrated) that determines whether characteristics are good or bad based on the signal from the characteristics good/bad detection sensor 18.

The first positive-pressure air passages 12g1 to 12g5 are formed on the first flat surface 12a of the support disk 12 so that, when the storage hole group G14d stops at the work return location, their front openings face the rear openings of the multiple storage holes 14d constituting the storage hole group G14d, respectively. The openings on the opposite side of the front openings of these first positive-pressure air passages 12g1 to 12g5 are each connected to an air circuit via a tube (not illustrated).

The second positive-pressure air passages 12h1 to 12h5 are formed on the first flat surface 12a of the support disk 12 so that, when the storage hole group G14d stops at the work disposal location, their front openings face the rear openings of the multiple storage holes 14d constituting the storage hole group G14d, respectively. The openings on the opposite side of the front openings of these second positive-pressure air passages 12h1 to 12h5 are each connected to an air circuit via a tube (not illustrated).

According to this work insertion device (sixth embodiment), the following functions can be achieved in addition to the work insertion operation achievable by the aforementioned work insertion device (first embodiment). These functions are useful when the work WO is a capacitor, inductor, resister or other electronic component having external electrodes on both ends in the length direction.

When the storage hole group G14d in which works are already stored stops at the work characteristics good/bad inspection location before the work insertion location as a result of intermittent turning of the transfer disk 14, whether the characteristics of each work WO stored in the multiple storage holes 14d constituting the storage hole group G14d are good or bad is detected separately by the characteristics good/bad detection sensor 18.

If even one work of bad characteristics is detected and consequently the storage hole group G14d stops at the work return location upstream of the work characteristics good/bad inspection location as a result of intermittent turning of the transfer disk 14, the positive-pressure air from one of the first positive-pressure air passages 12g1 to 12g5 corresponding to the storage hole 14d in which the work WO of good characteristics is stored is applied from the downward-facing openings to the upward-facing openings of the storage holes 14d in which works WO of good characteristics are stored and the works WO of good characteristics are discharged from the upward-facing openings of the storage holes 14d, with the discharged works WO returned to the work storage chamber 11c through the work return chute and stored again.

Also, if even one work of bad characteristics is detected and consequently the storage hole group G14d stops at the work disposal location upstream of the work return location as a result of intermittent turning of the transfer disk 14, the positive-pressure air from one of the second positive-pressure air passages 12h1 to 12h5 corresponding to the storage hole 14d in which the work WO of bad characteristics is stored is applied from the downward-facing opening to the upward-facing opening of the storage hole 14d in which the work WO of bad characteristics is stored and the work WO of bad characteristics is discharged from the upward-facing opening of the storage hole 14d, with the discharged work WO disposed of through the work disposal chute instead of being returned to the work storage chamber 11c.

Needless to say, the aforementioned returning and disposal of works WO do not occur when no work of bad characteristics is detected, in which case the storage hole group G14d in which works are already stored reaches the work insertion location as a result of intermittent turning of the transfer disk 14.

As described earlier, the many works WO introduced into the work storage chamber 11c have normally completed an appearance inspection, characteristics inspection, and various other inspections and therefore works of bad characteristics as mentioned above will not be detected. Should a work of bad characteristics as mentioned above be detected, however, it can be prevented without fail for the storage hole group G14d in which works are already stored, including the work WO of bad characteristics, to reach the work insertion location. Another advantage is that, because only the works WO of good characteristics are returned into the work storage chamber 11c when even one work of bad characteristics is detected, the works WO of good characteristics are not wasted but they can be reused instead. Furthermore, when even one work of bad characteristics is detected, only the work WO of bad characteristics is disposed of instead of returning it into the work storage chamber 11c, which eliminates the concern that the work WO of bad characteristics may be reused.

Other Embodiments (1) Although the rotation center line RCL of the transfer disk 14 is inclined to form a sharp angle $\alpha$ (approx. 60 degrees in the figure) with the vertical line VL in the first through sixth embodiments, the same effects described in the section of the first embodiment can be achieved as long as the inclination angle is a sharp angle, or preferably in a range of 75 to 45 degrees.

(2) Although the work WO is shaped roughly as a rectangular solid whose reference dimensions have the dimensional relationships of length>width=height and the storage hole 14d in the transfer disk 14 is also shaped roughly as a rectangular solid whose length, width and height are slightly greater than the length, width and height of the work WO in the first through sixth embodiments, the same effects described in the section of the first embodiment can be achieved, even when the work WO is shaped roughly as a rectangular solid whose reference dimensions have the dimensional relationships of length>width>height or length=width=height or is shaped roughly as a sphere, as long as the shape of the storage hole 14d is changed to one that can store any such work WO.

(3) Although the transfer disk 14 has 120 storage holes 14d formed in it in the first through sixth embodiments, the same effects described in the section of the first embodiment can be achieved even when more than 120 storage holes 14d or fewer than 120 storage holes 14d are formed in the transfer disk 14.

(4) Although the 120 storage holes 14d are evenly divided into 24 storage hole groups G14d each including five storage holes 14d in the first through sixth embodiments, the same effects described in the section of the first embodiment can be achieved, even when they are evenly divided into fewer than 12 storage hole groups G14d each including more than five storage holes 14d, or evenly divided into more than 12 storage hole groups G14d each including fewer than five but two or more storage holes 14d, as long as the transfer disk 14 is intermittently turned in units of an angle corresponding to the number of even divisions.

(5) Although the air pockets 14e, 14f enclosing the multiple storage holes 14d constituting each storage hole group G14d are formed in the transfer disk 14 in the first through sixth embodiments, the front air pocket 14e can be eliminated if the number of air passages 15b is increased so that positive-pressure air is applied separately to each of the multiple storage holes 14d constituting the storage hole group G14d. Additionally, the front air pocket 14e can be eliminated if the number of the positive-pressure air passages 12f mentioned in the section of the fifth embodiment is increased so that positive-pressure air is applied separately to each of the multiple storage holes 14d constituting the storage hole group G14d. In short, the same effects described in the section of the first embodiment can be achieved even when the air pocket 14e or 14f is eliminated from the transfer disk 14.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, an article "a" or "an" may refer to a species or a genus including multiple species, and "the invention" or "the present invention" may refer to at least one of the embodiments or aspects explicitly, necessarily, or inherently disclosed herein. In this disclosure, any defined meanings do not necessarily exclude ordinary and customary meanings in some embodiments.

The present application claims priority to Japanese Patent Application No. 2012-268070, filed Dec. 7, 2012, and No. 2013-164764, filed Aug. 8, 2013, each disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. A work insertion device for sequentially inserting works such as electronic components into concaved parts arranged side by side on a tape, said work insertion device comprising:

a transfer disk whose rotation center line is inclined upward to form a sharp angle with a vertical line, and which has many storage holes capable of storing the works wherein the holes are formed through an outer periphery part and arranged at an equal angular interval in a circumferential direction, where the many storage holes are evenly divided into multiple storage hole groups each including multiple storage holes;

a disk driving mechanism for intermittently turning the transfer disk in units of an angle formed by two lines connecting centers of two adjacent storage hole groups on the transfer disk and a rotation center of the transfer disk;

a work storage chamber capable of storing many of the works in bulk state, which is positioned in a manner facing upward-facing openings of the multiple storage holes constituting at least one storage hole group on the transfer disk, and which is used to directly store works in the multiple storage holes constituting the storage hole group, through the upward-facing openings of the holes, as the transfer disk turns intermittently;

a work anti-drop means for preventing the works stored in the multiple storage holes constituting the storage hole group from dropping out through downward-facing openings of the holes as the storage hole group on the transfer disk in which works are already stored travels to a work insertion location away from the work storage chamber;

a work push-out means for forcibly pushing out the works stored in the multiple storage holes constituting the storage hole group through the downward-facing openings of the holes when the storage hole group of the transfer disk in which works are already stored stops at the work insertion location; and a work guiding means, which includes multiple guiding passages that incline downward toward the multiple concaved parts in the tape from the downward-facing openings of the multiple storage holes constituting the storage hole group stopped at the work insertion location, for guiding the works pushed out through the downward-facing openings of the multiple storage holes, into the multiple concaved parts, through the multiple guiding passages.

2. A work insertion device according to claim 1, wherein the work push-out means includes a positive-pressure air passage for applying positive-pressure air in the multiple storage holes constituting the storage hole group stopped at the work insertion location, with the positive-pressure air flowing from the upward-facing openings to the downward-facing openings of the respective holes.

3. A work insertion device according to claim 1, wherein the work guiding means includes a negative-pressure air passage for applying negative-pressure air in the multiple guiding passages, with the negative-pressure air flowing from the upward-facing openings to the downward-facing openings of the respective passages.

4. A work insertion device according to claim 1, wherein the multiple guiding passages have enough length to store multiple works inside in succession.

5. A work insertion device according to claim 4, wherein the work guiding means includes a second negative-pressure air passage for controlling insertion into the multiple concaved parts, respectively, of first works among the multiple works stored in the multiple guiding passages.

6. A work insertion device according to claim 4, wherein the work guiding means includes a moving rod for controlling insertion into the multiple concaved parts, respectively, of first works among the multiple works stored in the multiple guiding passages.

7. A work insertion device according to claim 4, wherein the work guiding means includes a moving suction nozzle for controlling insertion into the multiple concaved parts, respectively, of first works among the multiple works stored in the multiple guiding passages.

8. A work insertion device according to claim 1, further comprising:
   a storage good/bad detection means for separately detecting whether storage of each work in the multiple storage holes constituting the storage hole group is good or bad when the storage hole group on the transfer disk in which works are already stored stops at a work storage good/bad inspection location before the work insertion location; and
   a work returning means for returning to and storing again in the work storage chamber all works stored in the storage holes constituting the storage hole group when even one badly stored work is detected by the storage good/bad detection means.

9. A work insertion device according to claim 1, wherein the work is an electronic component and that said work insertion device further comprises:
   a characteristics good/bad detection means for separately detecting whether characteristics of each work in the multiple storage holes constituting the storage hole group are good or bad when the storage hole group on the transfer disk in which works are already stored stops at a work characteristics good/bad inspection location before the work insertion location;
   a work returning means for returning to and storing again in the work storage chamber the works of good characteristics among the works stored in the storage holes constituting the storage hole group when even one work of bad characteristics is detected by the characteristics good/bad detection means; and
   a bad work disposal means for disposing, when even one work of bad characteristics is detected by the characteristics good/bad detection means, of the work of bad characteristics among the works stored in the storage holes constituting the storage hole group, instead of returning it to the work storage chamber.

* * * * *